United States Patent [19]

Pace et al.

[11] Patent Number: 4,764,670
[45] Date of Patent: Aug. 16, 1988

[54] COLOR FILTER ARRAYS

[75] Inventors: Laurel J. Pace; Jeffrey C. Blood, both of Rochester, N.Y.

[73] Assignee: Eastman Kodak Company, Rochester, N.Y.

[21] Appl. No.: 91,802

[22] Filed: Sep. 1, 1987

Related U.S. Application Data

[63] Continuation-in-part of Ser. No. 876,510, Jun. 20, 1986, abandoned.

[51] Int. Cl.$^4$ .................................................. G01J 3/50
[52] U.S. Cl. ..................................... 250/226; 350/166
[58] Field of Search .................... 430/7, 12, 15, 17; 250/211 R, 211 J, 226, 578; 350/311, 313, 316, 166; 340/752, 762, 784, 785; 358/331

[56] References Cited

U.S. PATENT DOCUMENTS

| | | | |
|---|---|---|---|
| 1,003,720 | 9/1911 | Dufay | 430/7 |
| 1,191,034 | 7/1916 | Rheinberg | 430/206 |
| 4,081,277 | 3/1978 | Brault et al. | 250/226 |
| 4,294,900 | 10/1981 | Aono | 430/7 |
| 4,307,165 | 12/1981 | Blazey et al. | 430/8 |
| 4,315,978 | 2/1982 | Hartman | 430/4 |
| 4,387,146 | 6/1983 | Whitmore | 430/7 |
| 4,395,629 | 7/1983 | Sasano et al. | 350/166 |
| 4,411,973 | 10/1983 | Gilmour et al. | 430/7 |

FOREIGN PATENT DOCUMENTS 0030476 10/1983 European Pat. Off. .

Primary Examiner—David C. Nelms
Attorney, Agent, or Firm—Carl O. Thomas

[57] ABSTRACT

A color filter array is disclosed comprised of red, green, and blue filters forming an interlaid pattern. Each of the red, green, and blue filters is formed of two superimposed filter layers, each made up of a different subtractive primary dye. Layers of controlled thickness containing a single dye permit precise control of filter density and hue. The color filter array can form part of a viewable display unit or form part of an image sensor.

27 Claims, 3 Drawing Sheets

| Y1 | C2 | Y1 | C2 | Y1 | C2 | Y1 | C2 |
|---|---|---|---|---|---|---|---|
| M1 | C1 | M1 | C1 | M1 | C1 | M1 | C1 |

COLOR FILTER ARRAYS

This application is a continuation-in-part of Ser. No. 876,510, filed June 20, 1986, now abandoned.

FIELD OF THE INVENTION

The invention relates to color filter arrays, visual display units including color filter arrays, and sensors including color filter arrays.

BACKGROUND OF THE INVENTION

Color filter arrays formed of additive primary filters (blue, green, and red filters) laterally displaced in interlaid patterns have been used for imaging since near the turn of the century. Additive primary multicolor images were formed using a continuous, panchromatically sensitized silver halide emulsion layer exposed and viewed through an array of additive primary filters. Exposure through the filter array allows silver halide to be selectively developed either in exposed or unexposed areas. A multicolor image can be viewed by reflection or, more commonly, projection through the developed silver and color filter array.

Dufay U.S. Pat. No. 1,003,720 teaches forming an additive multicolor filter by alternately printing two thirds of a filter element with a greasy material to leave uncovered an array of areas. An additive primary dye is imbibed into the filter element in the uncovered areas. By repeating the sequence three times the entire filter area is covered by an interlaid pattern of additive primary filters. Rheinberg U.S. Pat. No. 1,191,034 attempts an essentially similar effect by using subtractive primary dyes (yellow, magenta, and cyan) which are allowed to diffuse laterally so that two substractive primaries are fused in each area to produce an additive primary color fitler array. In more recent investigations of imaging with additive multicolor filters placement of the additive primary filters in microcells to control their lateral definition is taught by Blazey et al U.S. Pat. No. 4,307,165, Whitmore U.S. Pat. No. 4,387,146, and Gilmour et al U.S. Pat. No. 4,411,973.

Color filter arrays comprised of interlaid patterns of additive primary filters have also been employed in connection with image sensors. Forming color filter arrays useful with semiconductor sensors has proven particularly challenging because of the small individual sensor areas, commonly less than $1 \times 10^{-8}$ m$^2$ in area, with areas of less than $1 \times 10^{-10}$ m$^2$ often being sought. Hartman U.S. Pat. No. 4,315,978 is considered representative. Filters of one additive primary color are formed by imagewise exposing a layer comprised of a combination of a mordant and a photopolymer. Following development to remove unexposed portions of the layer, the additive primary dye is imbibed. The process is then twice repeated to produce the second and third sets of additive primary filters.

One difficulty encountered in preparing the color filter arrays of Hartman is that combinations of dyes within a single filter element are required. In theory a blue dye transmits blue (400 to 500 nm) light while absorbing green and red (500 to 700 nm) light, a green dye transmits green (500 to 600 nm) light while absorbing blue and red (400 to 500 nm and 600 to 700 nm) light, and a red dye transmits red (600 to 700 nm) light and absorbs blue and green (400 to 600 nm) light. In practice rarely does any one dye absorb light efficiently throughout the two thirds of the visible spectrum in which absorption is desired. The result is that mixtures of additive primary dyes are usually required to approximate the theoretically desired absorption profiles. When different dyes are imbibed to form the same filter element, disadvantages are encountered because of the difficulty in predicting and reproducibly controlling the proportions of the different dyes. The result can be wide variations in absorption and transmission characteristics.

In addition to teaching the use of additive primary dyes, Hartman teaches that mixtures of subtractive primary (yellow, magenta, and cyan) dyes can be used to form additive primary filters. Using mixtures of subtractive primary dyes carries the same disadvantages as using dye mixtures in general and, in addition, because of the necessarily diverse absorption and transmission profiles of the individual subtractive primary dyes which must be mixed in a single filter element, the potential for variations in absorption and transmission characteristics is increased.

Aono U.S. Pat. No. 4,294,900 teaches producing additive primary filters by superimposing two silver halide emulsion layers containing subtractive primary dyes. Aono employs in the silver halide emulsion layers dyes of a specialized type called colored couplers of one subtractive primary color which on coupling with oxidized developing agent following imagewise exposure form dyes of another subtractive primary color. This approach does not permit the precise control of dye hue or location. It is well known that some unwanted silver halide grain development, referred to as fog or minimum density, always occurs. At the same time incomplete development of exposed silver halide is quite common. The result is that the filters of Aono contain unwanted mixtures of colored coupler dyes of one hue and coupling formed dyes of another hue. Further, the competing reactions often occur during coupling, leading to reaction product mixtures. The scattering of light during exposure and the migration of oxidized developing agent to effect coupling inherently results in only loosely controlled dye boundaries. Finally, using silver halide emulsions non-uniformities in dye patterns, referred to as granularity, is an art recognized concern.

Multicolor filter arrays have been constructed that employ combinations of filters other than interlaid sets of blue, green, and red filters. Sasano et al European Pat. No. 30,476 is illustrative of the contruction of a filter array consisting of interlaid sets of first and second subtractive primary (e.g., cyan and yellow) filters and additive primary (e.g., green) filters which result from laterally extending and superimposing portions of the the subtractive primary filters. This filter arrangement is specifically designed for sensors of a type that require the green signal to be subtracted from the cyan signal to produce an accurate blue signal and the the green signal to be subtracted from the yellow signal to produce an accurate red signal. These filters differ in transmission and therefore construction requirements from blue, green, and red color filter arrays.

SUMMARY OF THE INVENTION

In one aspect this invention is directed to a filter array comprised of interlaid sets of laterally displaced first, second, and third additive primary filters, characterized in that the sets of filters are comprised of two discrete bottom layers, one bottom layer containing a first substractive primary dye forming a bottom layer of the first and second filters and a second bottom layer containing a second subtractive primary dye forming a bottom layer of the third filters and the sets of filters are comprised of two discrete overlying layers, one overlying layer containing the second subtractive primary dye forming an overlying layer of the first filters and a second overlying layer containing a third subtractive primary dye forming an overlying layer of the second and third filters, at least one of the bottom and overlying layers being of controlled thickness and containing a single subtractive primary dye.

In another aspect this invention is directed to a light sensing semiconductor device including an array of light sensing pixels each less than $1 \times 10^{-8}$ m$^2$ in area comprised of a semiconductive substrate including a light sensing portion in each pixel area and a filter array for directing light to the semiconductive substrate comprised of interlaid sets of laterally displaced first, second, and third additive primary filters each overlying one pixel. The device is characterized in that the sets of filters are comprised of two discrete bottom layers, one bottom layer containing a first subtractive primary dye forming a bottom layer of the first and second filters and a second bottom layer containing a second subtractive primary dye forming a bottom layer of the third filters and the sets of filters are comprised of two discrete overlying layers, one overlying layer containing the second subtractive primary dye forming the first filter and a second overlying layer containing a third subtractive primary dye forming the second and third filters, at least one of the bottom and overlying layers being of controlled thickness and containing a single subtractive primary dye.

In an additional aspect this invention is directed to a device for displaying color images on a viewable surface comprised of a plurality of laterally displaced pixel areas, means for modulating within each pixel area the luminance of light transmitted to the viewable surface and a filter array for controlling within each pixel area the chrominance of light transmitted to the viewable surface comprised of interlaid sets of laterally displaced first, second, and third additive primary filters each overlying one pixel. The device is characterized in that the sets of filters are comprised of two discrete bottom layers, one bottom layer containing a first subtractive primary dye forming a bottom layer of the first and second filters and a second bottom layer containing a second subtractive primary dye forming a bottom layer of the third filters and the sets of filters are comprised of two discrete overlying layers, one overlying layer containing the second subtractive primary dye forming an overlying layer of the first filters and a second overlying layer containing a third subtractive primary dye forming an overlying layer of the second and third filters, at least one of the bottom and overlying layers being of controlled thickness and containing a single subtractive primary dye.

The present invention offers the advantage of providing interlaid patterns of blue, green, and red filters, useful in image recording or direct viewing, which more accurately restrict light transmission to a single selected blue, green, or red region of the visible spectrum. At the same time the filters are by reason of their construction relatively invariant in both density and hue. Further, the filters can be spatially delineated with a high degree of precision, thereby permitting applications to be served requiring exceedingly small pixel areas. The invention offers the particular advantage in facilitating spatial definition in that individual filter components can occupy areas which are multiples of the areas of the pixels they form. This can markedly reduce the layer boundaries required to form interlaid filter patterns.

The present invention also makes possible semiconductor image sensors of pixel areas of $1 \times 10^{-8}$ m$^2$ having the above advantages of reproducible high levels of spatial, hue, and density fidelity in image sensing and recording. Further, the filter elements have the advantage of being capable of manufacture by techniques entirely compatible with the semiconductor sensors.

The invention additionally makes possible viewable multicolor images having the above advantages of reproducible high levels of spatial, hue, and density fidelity. When employed in combination with conventional imaging luminance modulators, the color filter arrays permit multicolor images capable of reflection or projection viewing to be generated.

BRIEF DESCRIPTION OF THE DRAWING

The specific advantages of this invention can be better appreciated by reference to the description of preferred embodiments considered in conjunction with the drawings, in which.

Figure 1:
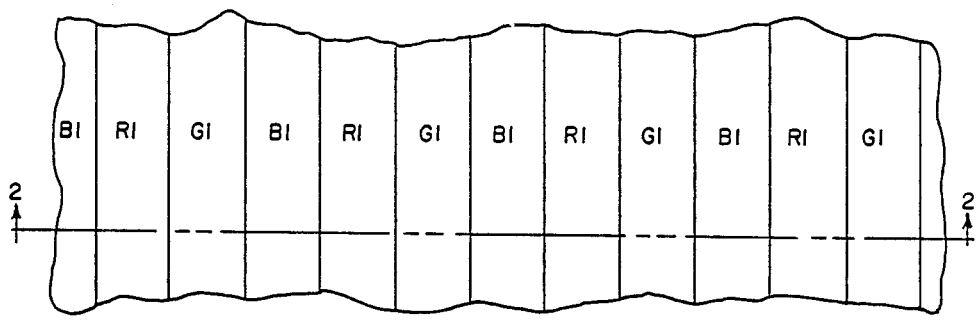
FIGS. 1 and 3 are plan details of two alternative filter arrays according to the invention.

Both absolute and relative dimensions of features in the drawings have been increased to facilitate depiction.

DESCRIPTION OF PREFERRED EMBODIMENTS

The color filter arrays of this invention exhibit interlaid patterns of blue, green, and red filters, each filter being laterally displaced with respect to the remaining filters. Although not required, for most applications all filters conveniently lie in a common plane, such as on a common planar support surface.

The color filters can take a variety of shapes and can be interlaid in a variety of patterns. The filters can, for example, be fabricated in any of the patterns disclosed by Blazey et al U.S. Pat. No. 4,307,165, Whitmore U.S. Pat. No. 4,387,146, and Gilmour et al U.S. Pat. No. 4,411,973, cited above.

Figure 3:
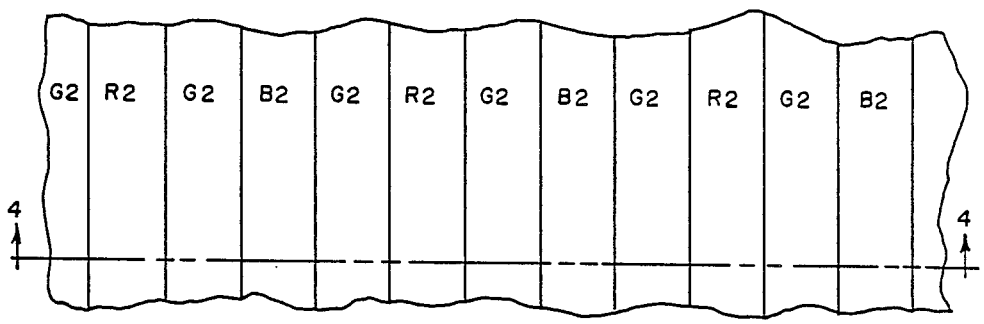

Since electronic imaging is currently most commonly practiced with orthogonal patterns, the color filter arrays of the invention are illustrated by reference to orthogonal patterns. Two simple filter arrays of differing patterns are shown in FIGS. 1 and 3, in which blue, green, and red filters B1, G1, and R1 in FIG. 1 and B2, G2, and R2 in FIG. 3 take the form of stripes lying in a common plane. The filter array of FIG. 1 contains an equal number of blue, green, and red filters, while the filter array of FIG. 3 provides one blue, one red, and two green stripes in each repeating sequence. The reason for relatively increasing the frequency of green stripes is that the human eye derives most of its information from green portion of the spectrum. Thus, it is often desirable to give added weighting to green light in image sensors.

Figure 2:
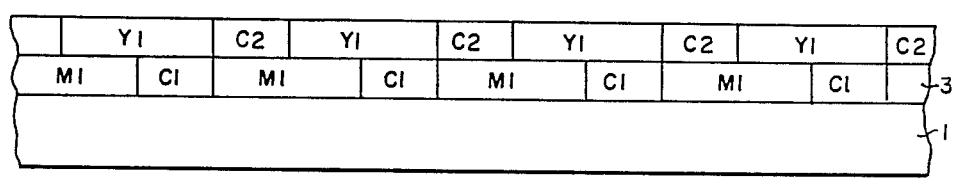
FIG. 2 is a sectional view taken along section line 2—2 in FIG. 1.

One possible construction of the filter array of FIG. 1 is shown in FIG. 2. A transparent support 1 presents an upper surface 3 on which are positioned two, separate interlaid layers. A layer M1 contains a first subtractive primary dye, in this instance a magenta dye, and a layer C1 contains a second subtractive primary dye, in this instance a cyan dye. Overlying the layers M1 and C1 are positioned two, separate interlaid layers, C2 and Y1. The layer C2 also contains a second subtractive primary dye, in this instance a cyan dye, and the layer Y1 contains a third subtractive primary dye, in this instance a yellow dye.

It can be seen that each of the blue, green, and red filters is formed of two layers. The blue and red filters share the common magenta layer M1. The green and red filters share the common yellow layer Y1. The lower layer C1 of each green filter and the upper layer C2 of each blue filter contain a cyan dye. The layers C1 and C2 can, but need not, contain the same cyan dye. Further, since the layers C1 and C2 are contiguous, it is apparent that they can together form a single layer forming the upper layer of blue filters and the lower layer of green filters.

It is appreciated that the specific layer choices shown to form the color filter array pattern of FIG. 1 are only exemplary of several alternative layer choices. In the filter construction of FIG. 2 the layer locations of the magenta and yellow dyes can be interchanged. Similarly, the layer locations of the cyan and yellow or cyan and magenta dyes can be interchanged. Also, the position of the two upper layers can be interchanged that of the two lower layers.

Figure 4:
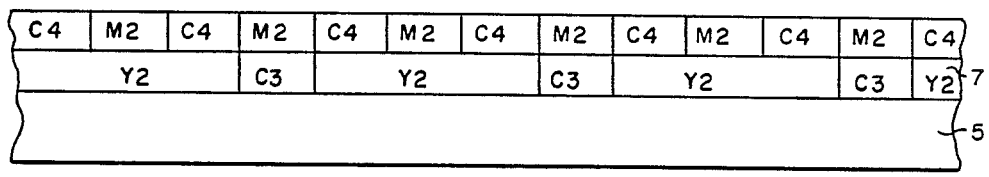
FIG. 4 is a sectional view taken along section line 4—4 in FIG. 3.

An exemplary construction of the color filter array of FIG. 3 is shown in FIG. 4. A transparent support 5 is shown to present an upper surface 7 on which are positioned two, separate interlaid layers. A layer Y2 contains a first subtractive primary dye, in this instance a yellow dye, and a layer C3 contains a second subtractive primary dye, in this instance a cyan dye. Overlying the lower layers Y1 and C3 are positioned two, separate interlaid layers, M2 and C4. The layer C4 also contains a second subtractive primary dye, in this instance a cyan dye, and the layer M2 contains a third subtractive primary dye, in this instance a magenta dye.

It can be seen that each of the blue, green, and red filters is formed of two layers. The green and red filters share the common yellow layer Y2. The blue and red filters share the common magenta layer M2. The lower layer C3 of each blue filter and the upper layer C4 of each green filter contain a cyan dye. The layers C3 and C4 preferably contain the same cyan dye. Further, since the layers C3 and C4 are contiguous, it is apparent that they can together form a single layer, which forms the upper layer of green filters and the lower layer of blue filters.

It is appreciated that the specific layer choices shown to form the color filter array pattern of FIG. 3 is only exemplary of several alternative layer choices. In the filter construction of FIG. 4 the layer locations of the cyan and yellow dyes can be interchanged. Also, the two upper layers can be interchanged in position with the two lower layers. Interchanging the magenta dye with either the yellow or cyan dye will change the relative frequency of green, blue, and red filters, but can be undertaken, if this result is intended for a specific application.

In the filter array patterns of FIGS. 1 and 3 the widths of the blue, green, and red stripes are normally chosen to coincide with the desired width of individual pixels, but the stripes are not capable of defining the orthogonal areal dimension—e.g., the length—of the pixels. Another element used with the filter array, such as an array of image sensors or a conventional luminance modulator, is relied upon to define the length of each pixel.

As employed herein the term "pixel" is defined as a single areally limited information unit of an image. The number of pixels making up an image can be widely varied, depending upon the application. In the United States a broadcast television image contains approximately 262,144 pixels. While filter arrays containing far fewer pixels can be employed for conveying information in image form, for pictorial imaging filter arrays according to this invention containing at least about $2 \times 10^5$ pixels are contemplated, with megapixel filter arrays, those with at least $1 \times 10^6$ pixels, being contemplated for producing images of high visual quality.

Figure 5:
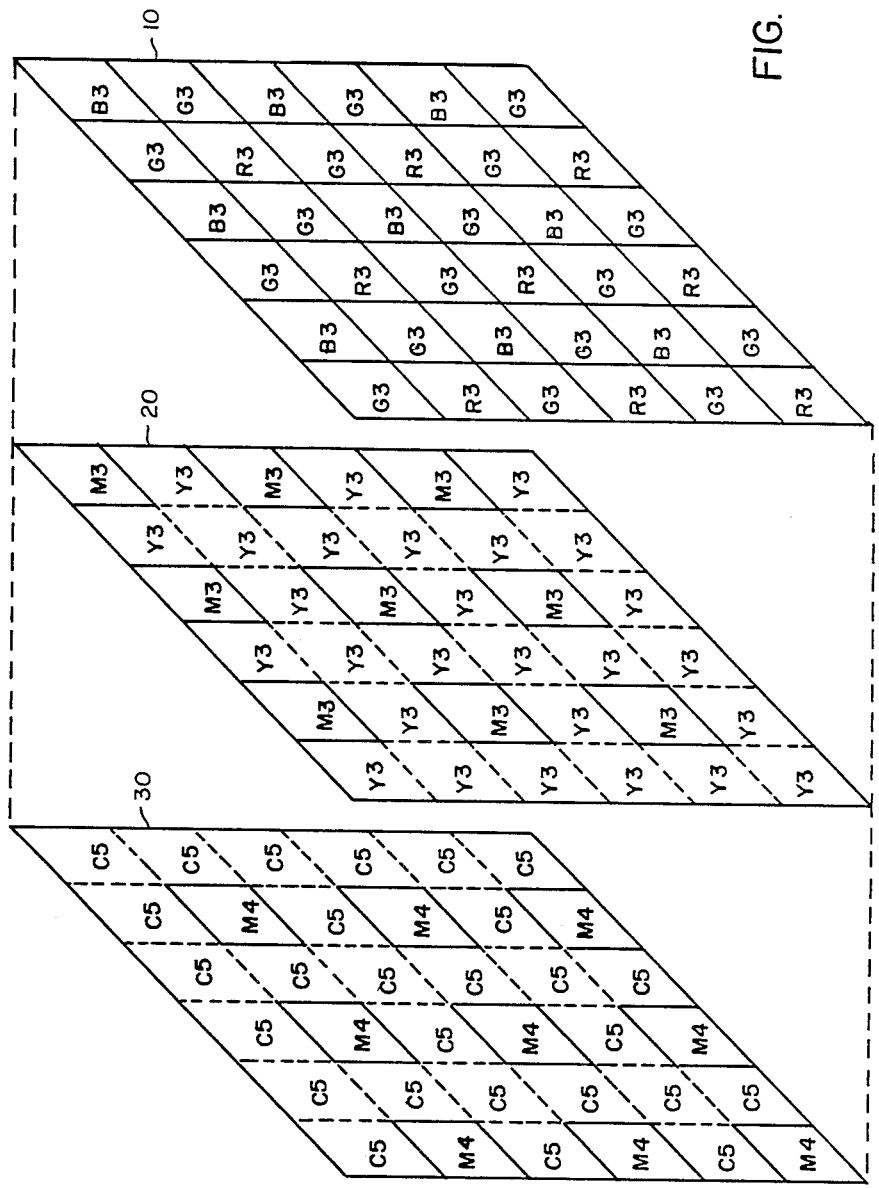
FIG. 5 is an expanded isometric detail of 36 pixels showing the spatial relationship of a third filter array and the layers which form the array.

It is possible to construct filter arrays according to the present invention in which individual blue, green, and red filters are each limited to a single pixel. In FIG. 5 is shown an exemplary pattern 10 of single pixel blue filters B3, green filters G3, and red filters R3. The layer arrays 20 and 30 show two subtractive primary layer patterns which can be superimposed to produce the blue, green, and red filter pattern. The layer array 20 is comprised of two layers Y3 and M3, containing a yellow dye and a magenta dye, respectively. The layer array 30 is comprised of two layers M4 and C5, containing a cyan dye and a magenta dye, respectively. The layer Y3 is restricted to areas forming fiters G3 and R3. The layer C5 is restricted to areas forming the filters G3 and B3. The layer M3 is restricted to areas forming the filters B3 while the layer M4 is restricted to areas forming the filters R3.

Within the 36 pixel detail of the layer arrays shown, boundaries separating adjacent layers also form pixel boundaries. Pixel boundaries which are not layer boundaries are indicated by dashed lines. Within each layer array only half of the pixel boundaries require layer boundaries to be formed. Thus, the layer boundary requirements are considerably relaxed by this array construction.

FIG. 5, being schematic in nature, shows no support for the layer arrays. Either of the layer arrays can be coated nearest to a support with the remaining layer array overlying. As in the case of filter array of FIGS. 3 and 4, the cyan and yellow filters can be interchanged in position, if desired. The layers M3 and M4 can, if desired, contain the same magenta dye and can, if desired, be simultaneously formed using a single coating composition. The exemplary pixel defining filter pattern of FIG. 5 is noted to contain a disproportionate weighting of green to red and blue filters similar to that of FIGS. 3 and 4. However, it is appreciated that a pixel limited interlaid pattern of equal numbers of blue, green, and red filters could, if desired, be formed.

The filter arrays of FIGS. 1 through 5 rely on two superimposed layers, each containing a different subtractive primary dye, to produce each filter. This arrangement offers advantages in light transmission and absorption as compared to employing a filter constructed of an additive primary dye. To be effective an additive primary dye must transmit light in one of the blue, green, or red portions of the spectrum and efficiently absorb light in the remaining two thirds of the visible spectrum. For example, a filter containing a single green dye ideally requires a dye that transmits light from 500 to 600 nm while efficiently absorbing light from 400 to 500 nm and from 600 to 700 nm. These ideal green filter requirements can be much more easily approximated using two layers, one containing a yellow dye and one containing a cyan dye. Note that both the yellow and cyan dyes must transmit light efficiently in the 500 to 600 nm range. While the cyan dye is predominately transmissive in the 400 to 500 nm range and the yellow dye is predominantely absorptive in this wavelength range, the two dyes together can be effective with any combination of absorption and transmission properties in this spectral range that efficiently absorbs light. The same is true of the 600 to 700 nm region of the spectrum. Thus, while a green dye must be chosen to satisfy a rather rigid absorption and transmission profile, a cyan dye and a yellow dye can be employed in separate layers according to this invention with much more latitude in dye absorption and transmission characteristics being possible. The same considerations apply to the construction of blue and red filters.

It is a specific feature of this invention that at least one and preferably each of the filter layers is of controlled thickness and contains a single subtractive primary dye. The use of a single subtractive primary dye allows the hue (i.e., the spectral absorption and transmission profile) of the layer be more precisely controlled than is possible using a combination of dyes. A difference in proportions of either additive or subtractive primary dyes in combination has the unfortunate effect of shifting layer hue, while the use of a single dye entirely avoids this difficulty.

Employing filter layers of controlled thickness further enhances control of light absorption and transmission. The optical density of a filter layer is a direct function of the amount of dye it contains within a given area. Layers of uniform thickness containing a uniform dye concentration exhibit uniform optical density. While uniform optical density is theoretically possible by controlling the application of a dye to a non-uniform layer, in practice this has not been possible with commonly employed dye distribution techniques.

The filter layers are areally limited so that they occupy areas corresponding to no more than two of the three additive primary filter sets being constructed. While any feasible technique for limiting the areal extent of the filter layers is within the contemplation of this invention, for applications requiring limited areas of individual pixels, such as pixels of $1\times10^{-8}$ m$^2$ or less, the filter layers are most conveniently constructed by photopatterning.

A photopatterned filter layer is most conveniently constructed by coating a solution of a photoinsolubilizable material onto a planar support surface. After coating, the support is spun, creating centrifugal forces acting on the coated composition which shape it into a layer of uniform thickness. Thereafter solvent, most typically water, is removed by drying the layer either at ambient or elevated temperatures. The resulting solid layer is then exposed imagewise to actinic radiation, typically ultraviolet radiation, to define the desired pattern. After exposure, the layer is brought into contact with a developer which selectively washes off the layer in unexposed areas. The support bearing the layer is typically immersed in the developer or spun while being sprayed with the developer to insure uniform developer contact.

After the patterned filter layer is formed, it is preferably dyed with a single subtractive primary dye. This can be achieved by bringing the dye in solution into contact with the filter layer and imbibing the dye into the filter layer. As the dye enters the layer by imbibition, the filter layer increases in optical density in direct relation to the amount of dye imbibed. As saturation of the filter layer by the dye is approached, the rates of additional dye imbibition and therefore further increase in the optical density of the filter layer progressively decline. This offers the advantage that an aim optical density of the filter layer can be reproducibly achieved without precisely controlling the duration of imbibition. It is preferred to saturate the filter layer with the dye, where "saturation" is defined as a dye concentration which produces an optical density that is increased by less than 5 percent when the duration of dye imbibition is doubled.

After one of the two layers to be positioned on the support is formed, the second filter layer can be formed by the same sequence of steps, differing only in the pattern or its location and the subtractive primary dye imbibed. Referring to FIGS. 2 and 4, the steps of forming the second layer on the support can also form the first of the superimposed layers. For example, by spin coating support 1 bearing only the filter layer M1 and the next applied coating composition or the support 5 bearing only the filter layer Y2 and the next applied coating composition, a uniform layer is formed overlying the first formed filter layer where it is present and directly contacting the support in remaining areas. By suitable choice of the exposing pattern, layers C1 and C2 in FIG. 2 or the layers C3 and C4 in FIG. 4 can be concurrently formed using the same coating composition. In each instance this results in two integrally joined additional filter layers, a second filter layer lying directly on the support and a first overlying filter layer. The final overlying filter layer can be formed by repeating the above sequence of steps, changing only the pattern of exposure and the subtractive primary dye employed.

In addition to the advantages noted above for saturation of the filter layers, it should be noted that saturation of a filter layer serves to inhibit imbibition of dye from a contiguous filter layer to a greater extent than when a lower concentration of dye is present. However, it should be noted that a filter layer through saturated with one subtractive primary dye can in some instances still accept a different dye. It should also be noted that when a filter layer initially containing no dye is patterned over another, dye containing filter layer, the overlying filter layer is susceptible to accepting dye by diffusion from the underlying filter layer. It is therefore preferred to construct the filter arrays of this invention so that the filter layers neither accept dye from or donate dye to an adjacent layer.

One specifically contemplated approach for minimizing wandering of a subtractive primary dye from its intended filter layer is to employ an ionic subtractive primary dye and a photoinsolubilizable binder which is capable of mordanting the dye or a photoinsolubilizable binder in combination with a mordant which together function as a photopatternable composition. By selection of specific dyes, as illustrated in the Examples below, dye wandering between filter layers can be effectively eliminated. Another option, compatible with the above approaches for minimizing wandering of subtractive primary dye noted above, is to locate a diffusion barrier on the surface of a filter layer after it is formed and before forming a contiguous filter layer. All of the above approaches are, of course, optional in that they need not be employed for applications which are not sensitive to some interface mixing of dyes from contiguous filter layers. Although use of any one effective approach is contemplated, superior results can be achieved generally by employing combinations of differing approaches.

The filter arrays according to the invention described above are in the form of separate elements useful in combination with known image sensors and image display devices. In alternate forms of the invention the filter arrays form integral components of the image sensors and image display devices.

Figure 6:
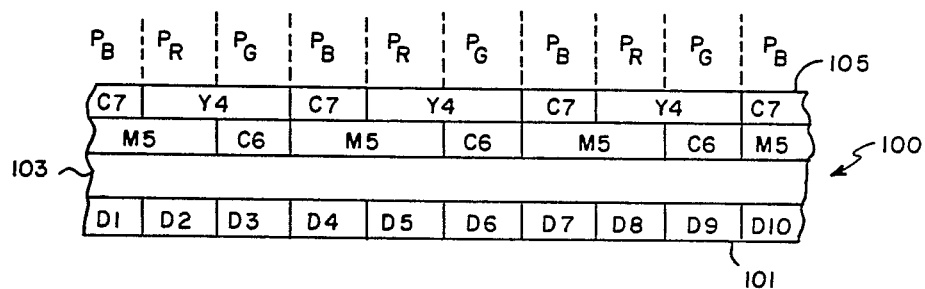
FIG. 6 is a schematic sectional view of a multicolor imaging device according to the invention.

One such alternate form of the invention is a device, of which the filter array is an integral part, for displaying multicolor images on a viewable surface. FIG. 6 is a schematic detail of such an integral multicolor image display device 100. A sectional view of a sequence of ten pixels is shown, including interlaid sets of green light transmitting pixels $P_G$, blue light transmitting pixels $P_B$, and red light transmitting pixels $P_R$. Light from the entire visible spectrum—e.g., white light—can be received at the lower surface 101 of the device. The light is first intercepted by an array of luminance modulators, indicated by D1, D2, D3, D4, D5, D6, D7, D8, D9, and D10, each occupying an area corresponding to one pixel. The luminance modulators are capable of selectively controlling the proportion of incident light which is transmitted. Their modulation range can extend from one extreme in which they are transparent—i.e., all incident light is transmitted—to a second extreme in which they are entirely opaque—i.e., no incident light is transmitted. In practice their modulation range can be much more limited. It is generally preferred that the luminance modulators have an optical density range of at least about 0.5, with an optical density range of at least 3.0 being preferred. The luminance modulators can be digital in nature, being capable of being switched only from one optical density extreme to the other. Alternatively, the luminance modulators can be selectively varied to any desired optical density between their extremes.

The luminance modulators vary the proportion of light transmitted in a controlled manner, but are not normally relied upon for chrominance discrimination. Chrominance discrimination in light transmission is the function of the filter layers, which are here shown for purposes of illustration as the filter layer pattern of FIG. 1. Since in this configuration the filters are coextensive with the pixel boundaries only in their widths, the luminance modulators are chosen to be coextensive with pixel boundaries. A transparent support 103 is shown interposed between the luminance modulators and the filter layers.

Functioning together the luminance modulators and the blue, green, and red filters formed by the filter layers permit white light received at the surface 101 to be transmitted as a multicolor image from the upper surface 105. The multicolor image can be projected onto a reflective surface, such as any conventional projection screen, for viewing. Alternately, the image can be viewed on the upper surface 105 of the device. The device works in essentially the same way if direction of light transmission through the device is reversed. Generally the pixels are made smaller than the unaided human eye can individually resolve, resulting in the sensation of differing hues in localized image areas.

To provide a specific example of a multi-color image display device, a panchromatically sensitized silver halide emulsion layer can be coated on support 103 to form a luminance modulator. While a continuous silver halide emulsion layer is limited in its ability to define precisely pixel boundaries, sharp pixel boundaries as well as pixel areas of less than $1 \times 10^{-8}$ m$^2$ can be realized by locating the emulsion layer in microcells.

To form a viewable multicolor image the silver halide emulsion layer of the device 100 is exposed imagewise through its upper surface 105. The filters allow only blue, green, or red light to reach the radiation sensitive silver halide in each microcell. For example, a blue filter transmits only blue light for exposure of the silver halide emulsion layer behind it. If the blue filter receives no light on exposure or only green and/or red light, no light is transmitted to the underlying emulsion layer. Thereafter the silver halide emulsion layer is developed to produce metallic silver imagewise in the microcells. The silver halide emulsion and development can be controlled so that nearly all or nearly none of the silver halide is reduced to metallic silver if light striking the microcell is above a threshold value or controlled so that metallic silver is formed as a direct or indirect function of the number of photons received during exposure. Direct positive silver halide emulsions produce metallic silver on development as an indirect function of light exposure while negative working silver halide emulsions produce metallic silver as a direct function of exposure. After development and fixing of any residual silver halide, white light incident upon the device 100 will produce a viewable multicolor image, which can be viewed by projection or directly on a device surface. Details of support, microcell, and silver halide emulsion composition and processing are disclosed by Blazey et al U.S. Pat. No. 4,307,165, Whitmore U.S. Pat. No. 4,387,146, and Gilmour et al U.S. Pat. No. 4,411,973, cited above. It is specifically contemplated that any other conventional luminance modulator can be substituted for the silver halide emulsion layer modulator disclosed.

Figure 7:
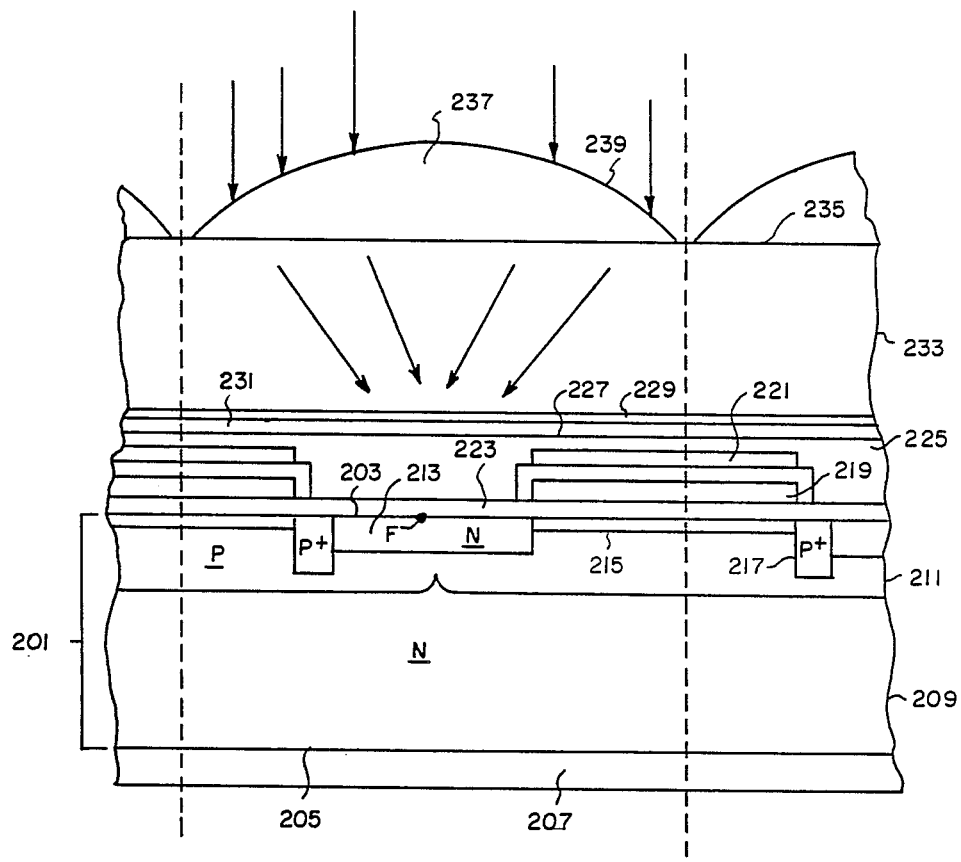
FIG. 7 is a sectional view of a single pixel of am interline charge coupled device employing a photodiode pixel sensor.

The integration of filters satisfying the invention into an image sensing device is also contemplated. Referring to FIG. 7 to illustrate the application of the invention to a preferred multipixel semiconductor device, a pixel, defined by parallel vertical dashed lines, of an interline charge coupled device (CCD) according to this invention is shown. A semiconductive substrate 201, typically a monocrystalline silicon substrate, is shown having an upper major surface 203 and a lower major surface 205. A conductive layer 207 covers the lower major surface. The semiconductive substrate has an N conductivity type region 209 and a P conductivity type well 211 formed by diffusion from the upper major surface 203. A photodiode is formed centrally in the pixel by N diffusion 213 from the upper major surface. The function of the photodiode is to supply electrons to the P well in proportion to the amount of light received on exposure.

The electrons are supplied to an adjacent charge coupled device. To create a buried channel for electron transfer a shallow N conductivity type region 215 is located adjacent the upper major surface. The buried channel thus formed extends from the photodiode to an adjacent CCD. To prevent unwanted lateral charge conduction, P+ conductivity type zones 217, referred to as channel stops, isolate the photodiode and the adjacent CCD from other adjacent surface structures.

A gate electrode 219, typically formed of polycrystalline silicon, is shown overlying the upper surface of the semiconductive substrate. Since polycrystalline silicon is transparent, a light shield 221, typically formed of aluminum, overlies the gate electrode. A transparent insulator 223 is shown overlying the entire upper major surface of the semiconductive substrate and also separating the gate electrodes from the light shields. Typically the insulator is silicon dioxide, with a surface laydown of passivant, such as borosilicate glass, being common. Although shown as a unit, the insulator is typically formed in several successive fabrication steps. A transparent insulative layer 225, commonly referred to as a planarizing layer, is positioned to provide a smoothed surface 227, shown as a planar surface, although in practice the surface can be non-planar. On this surface is positioned a filter array consisting of within the pixel boundaries superimposed filter layers 229 and 231. The filter array can be comprised of any one of the various orthogonal patterns previously described.

A relatively thick lens supporting layer 233 overlies the filter and presents an upper surface 235. A pixel lens element 237 is positioned on the upper surface of the support layer. The lens element is spaced inwardly from the boundaries of the pixel and hence is laterally spaced from lens elements of all adjacent pixels. The lens surface 239 can be semicylindrical, if desired, but is preferably hemispherical. In the optimum form of the invention the supporting layer surface 235 within the pixel boundaries is polygonal, and the lens edges are parallel to and spaced just inwardly of the pixel boundaries. This results in a pillow shaped lens.

Light striking the lens surface 239, indicated by vertical arrows, is bent inwardly, as indicated by the converging arrows in supporting layer 233. The light is shown directed to the focal spot F on the surface of the photodiode.

It should be noted that the inward directing of light from the lenses to the photodiode causes light to be received by only the central portion of the filter. Thus, the lens constructions allows edge alignments of the pixel boundaries and the filter elements to be relaxed without incurring an optical penalty.

While only one pixel of the exemplary semiconductor device is shown in FIG. 7, it is appreciated that actual devices typically contain very large numbers of essentially similar pixels, actual numbers ranging in the $10^3$ to $10^6$ orders of magnitude, depending on the application being served. While the invention has been described in terms of directing light to a photodiode, it is appreciated that many CCD's are constructed for directly sensing light and that for such applications each CCD sensor occupies a central pixel location. The lens construction, while capable of increasing light sensing efficiency, is not required for either photodiode or CCD sensors.

A variety of alternative semiconductor image sensor constructions compatible with the filters of this invention are known in the art. Bayer U.S. Pat. No. 3,971,065 particularly illustrates the relationship of filter constructions to image sensing. Murakoshi U.S. Pat. No. 4,455,575 illustrates sensors employing photodiodes in combination with CCD's. Ishihara U.S. Pat. No. 4,322,753 illustrates P well constructions for image sensors. Weiss U.S. Ser. No. 853,330, filed Apr. 18, 1986, titled LIGHT SENSING DEVICES WITH LENTICULAR PIXELS, commonly assigned, discloses details of preferred lens constructions.

The dye containing filter layers of the invention can take varied forms, depending upon materials and procedures chosen for their construction. In a specifically preferred fabrication approach photopatterned filter layers are first formed by coating uniform layers, imagewise exposing, washing off unexposed layer portions, and then dying the remaining filter layer by dye imbibition.

In one of the simpler approaches to forming filter layers by a photopatterning, dye imbibition process, hydrophilic colloids can be suspended in water along with a radiation responsive hardening (i.e..., crosslinking) agents to form photopatterned filter layers. Suitable hydrophilic colloids include substances such as proteins, protein derivatives, cellulose derivatives, and polysaccharides, more specifically, cellulose esters, gelatin—e.g. alkali treated gelatin (cattle bone or hide gelatin) or acid treated gelatin (pigskin gelatin), gelatin derivatives—e.g., acetylated gelatin and phthalated gelatin, dextran, gum arabic, zein, casein, pectin, collagen derivatives, collodion, agar-agar, arrowroot, and albumin, all generally known to be useful as binders in photographic elements, as illustrated by *Research Disclosure*, Vol. 176, December 1978, Item 17643. *Research Disclosure* is published by Kenneth Mason Publications, Ltd., Emsworth, Hampshire P010 7DD, England.

The hydrophilic colloic, preferably gelatin or a gelatin derivative, can be conveniently employed in combination with a dichromate salt, employed as radiation responsive hardening agent. The dichromate salt is, for example, potassium, sodium or ammonium dichromate. Dichromated gelatin has sufficient resolution for the filter elements of the color filter arrays for solid state imaging devices. It adheres well and is conveniently coated and developed using water solutions. For a fuller description of the use of dichromated gelatin as the radiation sensitive dyeable wash-off composition, reference is made to Land U.S. Pat. No. 3,284,208; Idelson U.S. Pat. No. 3,730,725; Fielding et al U.S. Pat. No. 3,925,082; and Chapter 13 of Friedman et al, "History of Color Photography," 1944, pp. 147-172. Gelatin and related hydrophilic colloids are known to exhibit some capacity for mordanting cationic dyes. Thus, relatively simple filter layer constructions are possible. It is, of course, recognized that conventional mordants can, if desired, be employed in combination.

For the most precise filter layer boundary definitions it is preferred to employ photoinsolubilizable polymers, commonly referred to as negative working photoresists. Further, to enhance dye immobilization within the filter layers, it is specifically preferred to incorporate a mordant within the photoresist coating composition.

Diazo resins are the preferred photoresponsive polymers for forming the filter layers. Many water soluble radiation sensitive diazo resins are useful. Particularly preferred are low molecular weight diazo resins which are acid condensation products of a diazonium salt of p-aminodiphenylamine, such as diphenylamine-4-diazonium halide or diphenylamine-4-diazonium phosphate, condensed in acid with aldehydes such as paraformaldehyde or formaldehyde and converted to a double metal salt, such as chlorozincate or fluoroborate. These resins are well known in the art and are described, for example, by Kosar, *Light Sensitive Systems*, pp. 323-324, John Wiley and Sons, NY, NY (1965). One particularly suitable diazo resin composition is the composition described in "Continuous-Tone Dyed Diazo Imaging Elements," *Research Disclosure*, Volume 169, Item 16976, May 1978.

The diazo resin is mixed with a mordant to produce a photopatternable coating composition employed to form the filter layers. A variety of mordants are known which are entirely compatible with the formation of a photopatterned layer by the diazo resin. Cationic mordants, capable of immobilizing anionic dyes, are particularly preferred. Useful mordants can be selected from among those disclosed by Sprague et al U.S. Pat. No. 2,548,564; Weyerts U.S. Pat. No. 2,548,575; Carroll et al U.S. Pat. No. 2,675,316; Yutzy et al U.S. Pat. No. 2,713,305; Saunders et al U.S. Pat. 2,756,149; Reynolds et al U.S. Pat. No. 2,768,078; Gray et al U.S. Pat No. 2,839,401; Minsk U.S. Pat. No. 2,882,156 and 2,945,006; Whitmore et al U.S. Pat. No. 2,940,849; Condax U.S. Pat. No. 2,952,566; Mader et al U.S. Pat. No. 3,016,306; Minsk et al U.S. Pat. Nos. 3,048,487 and 3,184,309; Bush U.S. Pat. No. 3,271,147; Whitmore U.S. Pat. No. 3,271,148; Jones et al U.S. Pat. No. 3,282,699; Wolf et al U.S. Pat. No. 3,408,193; Cohen et al U.S. Pat. Nos. 3,488,706, 3,557,066, 3,625,694, 3,709,690, 3,758,445, 3,788,855, 3,898,088, and 3,944,424; Cohen U.S. Pat. No. 3,639,357; Taylor U.S. Pat. No. 3,770,439; Campbell et al U.S. Pat. No. 3,958,995; *Research Disclosure*, Vol. 120, April 1974, Item 12045; and *Research Disclosure, Item* 16976, cited above.

Particularly preferred mordants are vinylbenzyl quaternary ammonium polymeric mordants which comprise a repeating unit which conforms to the structure:

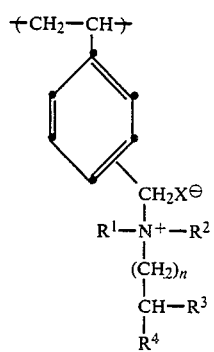

wherein:
- $R^1$ and $R^2$ are the same or different and are aryl, aralkyl or alkaryl having from 6 to about 20 carbon atoms or an alkyl group having from 1 to about 10 carbons atoms;
- $R^3$ and $R^4$ are either both hydrogen or, together with the carbon atom to which they are attached, form a saturated, unsaturated or aromatic ring or ring system containing from 5 to 10 carbon atoms such as cyclohexyl, cyclopentyl, phenyl, and naphthyl;
- X is an anion, such a halide, e.g., chloride; methosulfate; or p-toluene sulfonate; and
- n is 0, 1 or 2.

Where the mordant is a copolymer, the remainder of the polymeric mordant is not critical. Many ethylenically unsaturated monomers can be copolymerized with the vinylbenzene quaternary ammonium monomers to produce satisfactory mordants. Vinylene benzenes—e.g., styrene—are preferred ethyleneically unsaturated monomers for incorporation in the mordant copolymers. The quaternary ammonium containing repeating units usually comprise between 10 and 100, preferably 40 to 100 mole percent of the polymeric mordant.

Exemplary preferred cationic mordants are listed in Table I.

TABLE I

| | |
|---|---|
| M-1 | Poly(styrene-co-3-maleimidopropyl-N,N—dimethyl-N—benzyl ammonium chloride) (1:1) |
| M-2 | Poly(N—vinylbenzyl-N,N—dimethyl-N—allyl ammonium chloride) |
| M-3 | Poly(vinylimidazole) |
| M-4 | Poly(N—vinylbenzyl-N,N—dimethyl-N—propargyl ammonium bromide) |
| M-5 | Poly(styrene-co-N—vinylbenzyl-N,N—dimethyl-N—allyl ammonium chloride (1:1) |
| M-6 | Poly(vinyl pyridinium acetate chloride) |
| M-7 | Poly(N—vinylbenzyl-N,N—dimethyl-N—propyl ammonium bromide) |
| M-8 | Poly(N—vinylbenzyl-N,N,N—triethyl ammonium chloride) |
| M-9 | Poly(N—vinylbenzyl-N,N—dimethyl-N—propargyl ammonium chloride) |
| M-10 | Poly(N—vinylbenzyl-N,N,N—trimethyl ammonium chloride-co-ethylene glycol dimethylacrylate) (93:7) |
| M-11 | Poly(N—vinylbenzyl-N,N—dimethyl-N—allyl ammonium bromide-co-divinylbenzene) (95:5) |
| M-12 | Poly(styrene co-N—vinylbenzyl-N,N—dimethyl-N—allyl ammonium bromide-co-divinylbenzene) (49:49:2) |
| M-13 | Poly(N—vinylbenzyl-N,N—dimethyl-N—2-butenyl ammonium chloride) |
| M-14 | Poly(styrene-co-N—vinylbenzyl-N,N—dimethyl-N—allyl ammonium chloride) (1:4) |
| M-15 | Poly(styrene-co-N—vinylbenzyl-N,N,N—trimethyl ammonium chloride) (1:1) |
| M-16 | Poly(styrene-co-N—acrylamidopropyl-N—benzyl-N,N—dimethyl ammonium chloride) (1:1) |
| M-17 | Poly(N—vinylbenzyl-N—benzyl-N,N—dimethyl ammonium chloride) |
| M-18 | Poly(styrene-co-N—vinylbenzyl-N,N—dimethyl-N—butyl ammonium chloride) (1:1) |
| M-19 | Poly(1-vinylimidazole-co-1-vinyl-3-benzyl-imidazolium chloride) (1:1) |
| M-20 | Poly(1-methyl-2-methyl-5-vinyl pyridinium-p-toluenesulfonate) |
| M-21 | Poly(1-benzyl-4-vinyl pyridinium chloride) |
| M-22 | Poly(1-benzyl-2-methyl-5-vinyl pyridinium chloride) |
| M-23 | Poly(N—vinylbenzyl-N,N—dimethyl-N—carbamyl methyl ammonium chloride) |
| M-24 | Poly(N—vinylbenzyl-N,N— dimethyl-N—cyclohexyl ammonium chloride) |
| M-25 | Poly[N—vinylbenzyl-N,N—dimethyl-N—(3-methyl-2-butenyl) ammonium chloride] |
| M-26 | Poly(styrene-co-N—vinylbenzyl-N,N,N—trimethyl ammonium chloride) (1:2) |
| M-27 | Poly(N—vinylbenzyl-N,N—dimethyl-N—isobutyl ammonium chloride) |
| M-28 | Poly[N—(2-acrylamido-1,1-dimethylpropyl-N,N—dimethyl-N—benzyl ammonium chloride] |
| M-29 | Poly(N,N,N—trimethyl-N—vinylbenzyl ammonium chloride) |
| M-30 | Poly[styrene-co-benzyl(dimethyl)-p-vinyl-benzylammonium chloride] |
| M-31 | Poly(P,P,P—trioctyl-P—vinylbenzylphosphonium chloride) |
| M-32 | Poly(styrene-co-N—vinylbenzyl-N,N,N—trihexyl ammonium chloride) |
| M-33 | Poly(N,N,N—trimethyl-N—vinylbenzyl ammonium-co-styrene) |
| M-34 | Poly(styrene-co-N—vinylbenzyl-N,N—dimethyl-benzyl ammonium chloride-co-divinylbenzene) |
| M-35 | Poly(N—vinylbenzylpiperidinium chloride) |
| M-36 | Poly(4-vinylphenylcarbamylmethyl-N,N,N—trimethyl ammonium chloride) |
| M-37 | Poly(N—vinylbenzyl-N,N—dimethyl-N—acetonyl ammonium chloride) |
| M-38 | Poly(N—vinylbenzyl-N,N—dimethyl-N—methoxy-carbonylmethyl ammonium chloride) |

TABLE I-continued

| | |
|---|---|
| M-39 | Poly(N—vinylbenzylpyridinium chloride) |
| M-40 | Poly(N—vinylbenzyl-N—methylpyrrolidinium chloride) |
| M-41 | Poly(N—vinylbenzyl-N—methylpiperidinium chloride) |
| M-42 | Poly(N—vinylbenzyl-N—methylmorpholinium chloride) |
| M-43 | Poly(N—vinylbenzyl-N,N—dimethyl anilinium chloride) |

Corresponding anionic mordants can be prepared by substituting for the vinylbenzyl quaternary ammonium repeating units anionic repeating units derived from carboxylic acid substituted vinyl monomers, such as acrylic acid, methacrylic acid, α-chloroacrylic acid, or 1-propene-1,2,3,-tricarboxylic acid.

The relative amounts of mordant and diazo resin depend on the molecular weight and the mordanting strength of the mordant, the particular dyes to be used to make the color filter elements of the color filter array, and other factors. A preferred range of diazo resin is from about 0.16 to about 1.0 mg/dm$^2$ of coating, and a preferred range of mordant is from about 0.5 to about 5.0 mg/dm$^2$, most preferably from about 1.0 to 1.5 mg/dm$^2$. In making color filter arrays or solid state imaging devices, it is most common to coat by spin coating; however, other methods are useful. The resins are sensitive primarily to ultraviolet (UV) light and are usually processed using water such as by spraying or by immersing the layer in an agitated vessel.

While any subtractive primary dye which can be laid down uniformly in the desired filter layer pattern is useful in the practice of this invention, preferred dyes are ionic dyes, which are therefore capable of being immobilized by mordanting. Anionic dyes employed combination with cationic mordants are specifically preferred. Exemplary preferred yellow, magenta, and cyan dyes are listed in Table II.

TABLE II

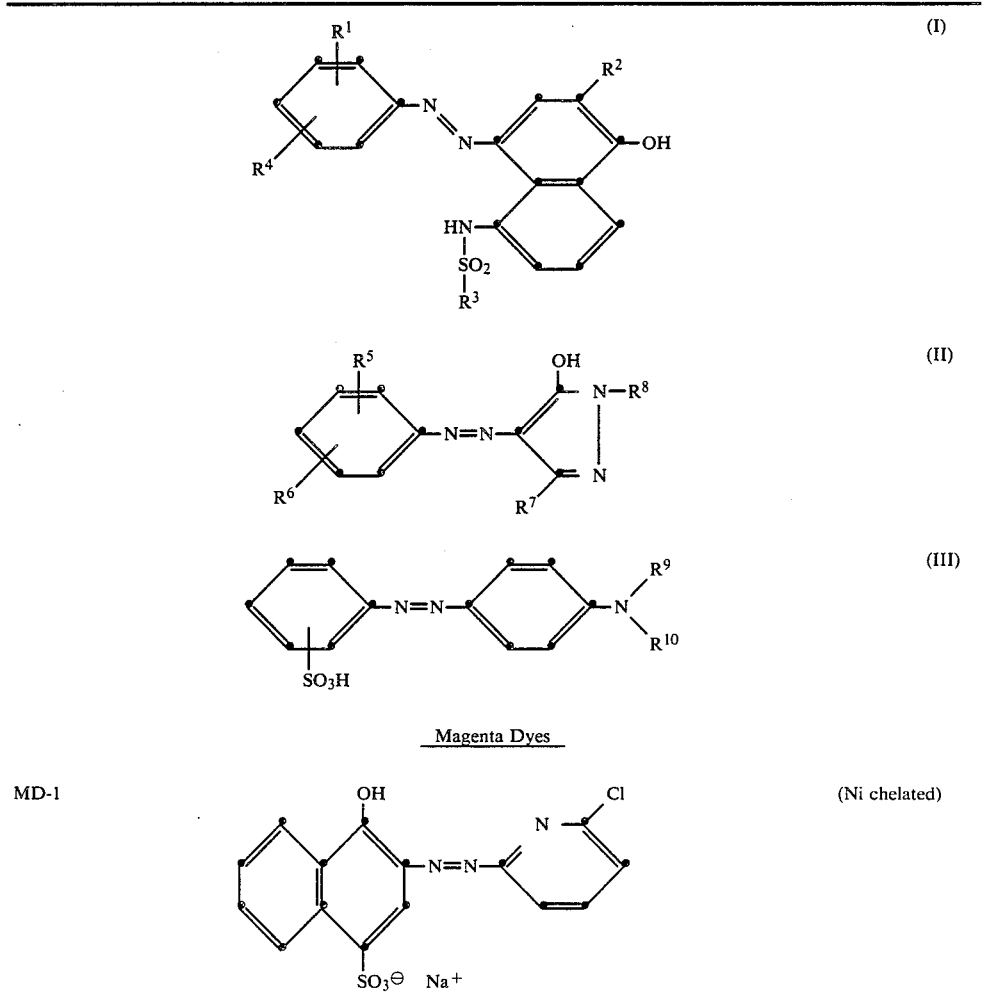

Magenta Dyes

MD-1  (Ni chelated)

TABLE II-continued
MD-2
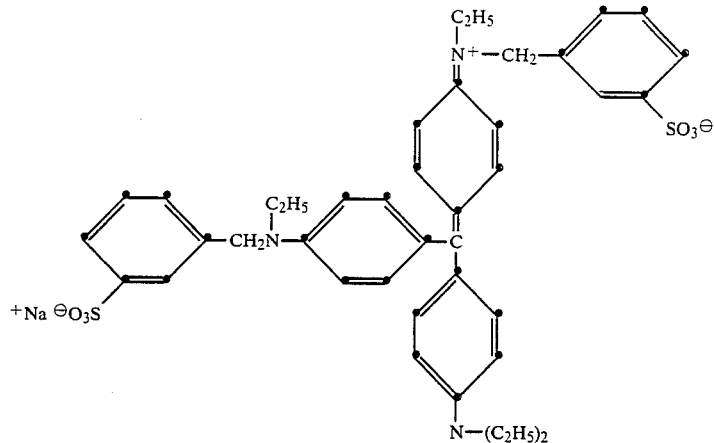
MD-3
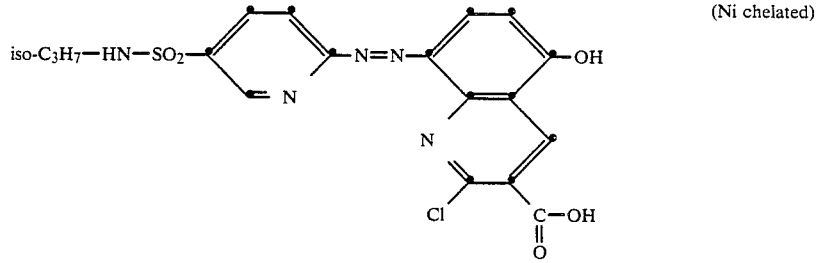
(Ni chelated)
MD-4
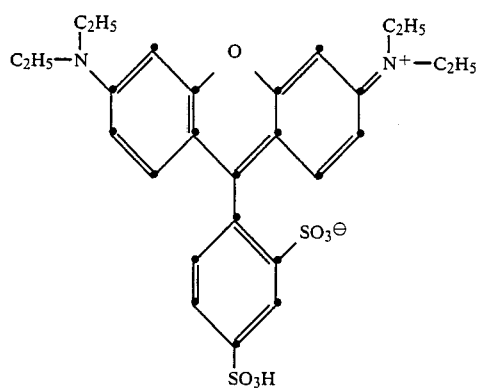
MD-5
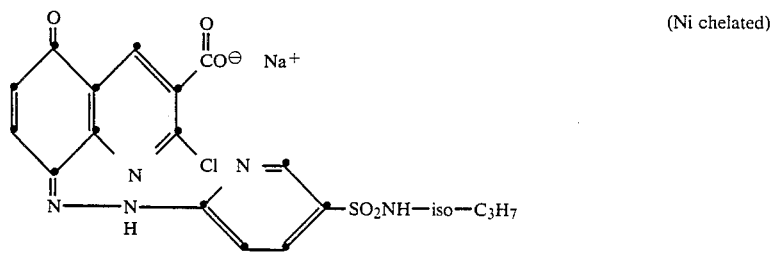
(Ni chelated)
MD-6
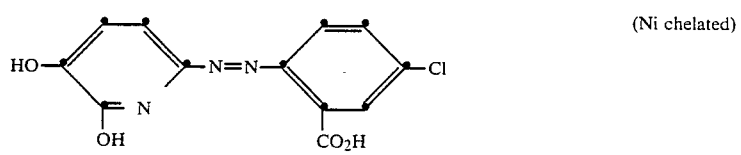
(Ni chelated)
MD-7
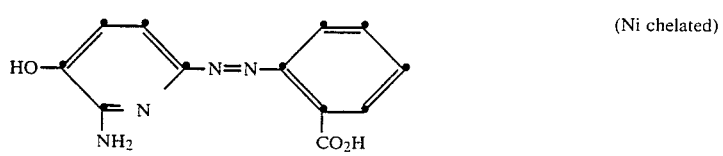
(Ni chelated)

TABLE II-continued

MD-8 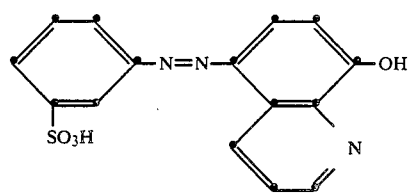 (Ni chelated)

MD-9 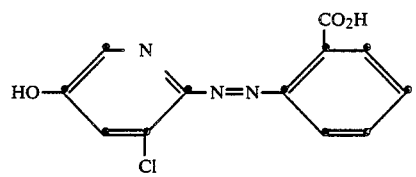 (Ni chelated)

MD-10 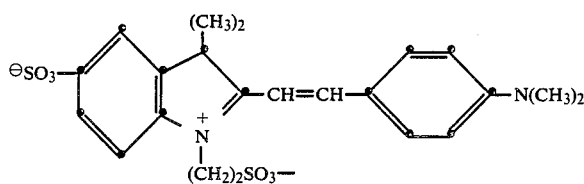

MD-11 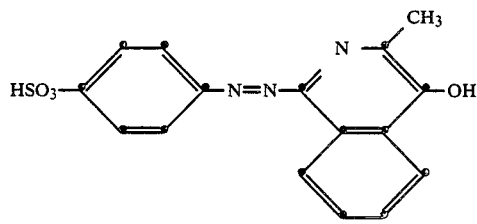 (Ni chelated)

MD-12 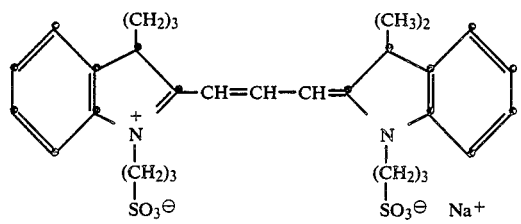

| Dye No. | $R^1$ | $R^2$ | $R^3$ | $R^4$ |
|---|---|---|---|---|
| MD-13 | —4-SO$_2$NH$_2$ | —SO$_2$NHCH$_2$CO$_2$H | —CH$_3$ | H |
| MD-14 | —3-CO$_2$H | —SO$_2$NHC(CH$_3$)$_3$ | —CH$_3$ | H |
| MD-15 | —4-SO$_3$H | —SO$_2$NHCH$_2$CO$_2$H | —CH$_3$ | H |
| MD-16 | —3-SO$_2$NH$_2$ | —SO$_2$NHCH$_2$CO$_2$H | —CH$_3$ | H |
| MD-17 | —3-SO$_2$CH$_3$ | —SO$_2$NHCH$_2$CO$_2$H | —CH$_3$ | H |
| MD-18 | —3-SO$_3$H | —SO$_2$NHCH$_2$CO$_2$H | —CH$_3$ | —2-Cl |
| MD-19 | —3-SO$_3$H | —SO$_2$NHCH$_2$CO$_2$H | —CH$_3$ | —4-Cl |
| MD-20 | —3-SO$_3$H | —SO$_2$C$_2$H$_4$CO$_2$H | —CH$_3$ | H |

Yellow Dyes

YD-1 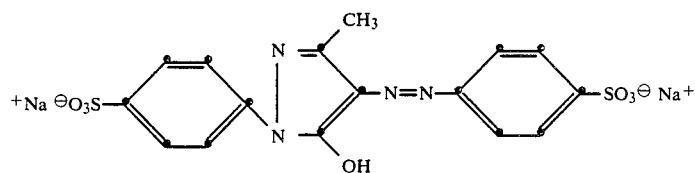

TABLE II-continued
YD-2 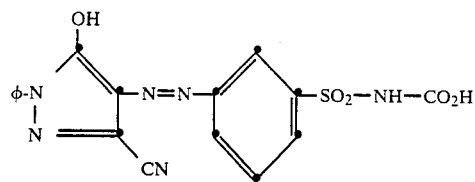
YD-3   Drimarine ® Brilliant Yellow K-362 (a monoazo dys with a chloropyrimidine reactive group)
YD-4 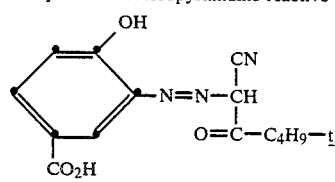  (Ni chelated)
YD-5 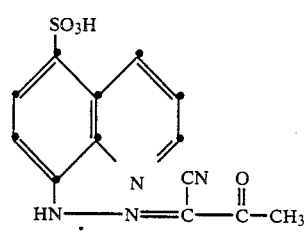  (Ni chelated)
YD-6 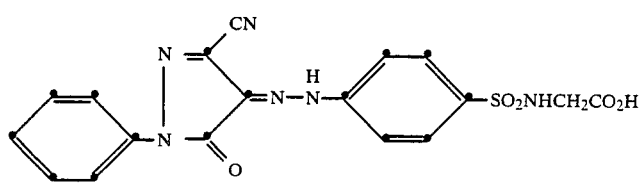
YD-7 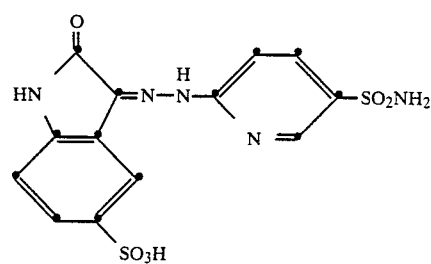  (Ni & Zn chelated)
YD-8 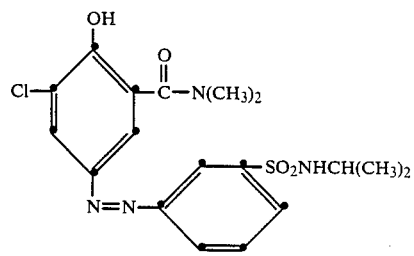
YD-9 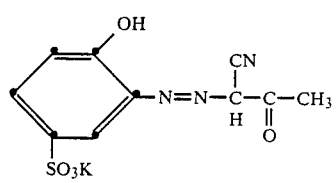

TABLE II-continued
YD-10
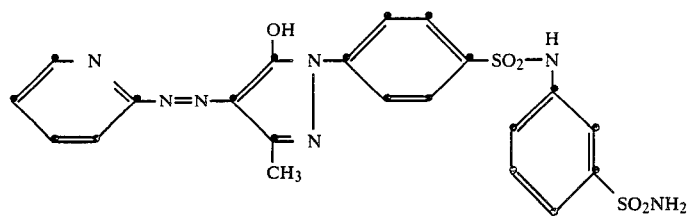
YD-11
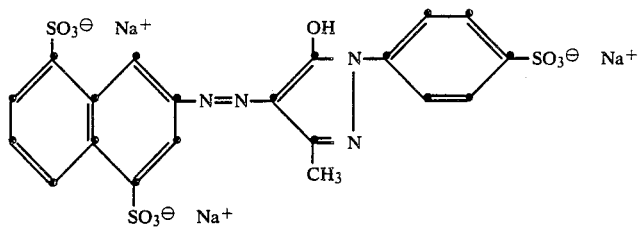
| Dye No. | $R^5$ | $R^6$ | $R^7$ | $R^8$ |
|---|---|---|---|---|
| YD-12 | —4-$SO_3H$ | H | —$CH_3$ | phenyl |
| YD-13 | —3-$SO_2NH_2$ | 5-$CO_2H$ | —CN | phenyl |
| YD-14 | —3-$SO_2NHCH_2CO_2H$ | H | —CN | phenyl |
| YD-15 | —4-$SO_3H$ | H | H | phenyl |
| YD-16 | —4-$SO_3H$ | H | —OH | phenyl |
| YD-17 | —4-$SO_2NH_2$ | H | —OH | phenyl-$SO_3H$ |
| YD-18 | —4-$SO_3H$ | H | —$CONH_2$ | phenyl |
| YD-19 | —3-Cl | H | —$CH_3$ | phenyl-$CO_2H$ |
| YD-20 | —3-$CO_2H$ | H | —$CH_3$ | phenyl-$CO_2H$ |

TABLE II-continued

| | | | | |
|---|---|---|---|---|
| YD-21 | —3-SO$_2$NHCH$_2$CO$_2$H | H | —CN | (phenyl ring) |

| Dye No. | R$^9$ | R$^{10}$ |
|---|---|---|
| YD-22 | —C$_2$H$_5$ | —C$_2$H$_4$SO$_3$H |
| YD-23 | —CH$_3$ | —CH$_3$ |
| YD-24 | —C$_2$H$_5$ | —C$_2$H$_4$NHSO$_2$CH$_3$ |

Cyan Dyes

CD-1 [structure]

CD-2  Copper phthalocyanine tetrasulfonic acid, tetrasodium salt

CD-3  Procion ™ turquoise HA (a sulfonated copper phthalocyanine containing a monochlorotriazine reactive group)

CD-4 [structure] (Ni chelated)

CD-5 [structure] (Ni chelated)

CD-6 [structure]

CD-7 [structure]

TABLE II-continued

| Dye No. | R¹ | R² | R³ | R⁴ |
|---|---|---|---|---|
| CD-8 | —2-SO$_2$(CH$_2$)$_2$CO$_2$H | —SO$_2$NHCH$_2$CO$_2$H | —CH$_3$ | 4-NO$_2$ |
| CD-9 | —2-SO$_2$(CH$_2$)$_2$CO$_2$H | Cl | 4-(SO$_2$NH$_2$)C$_6$H$_4$— | 4-NO$_2$ |
| CD-10 | —2-SO$_2$(CH$_2$)$_2$CO$_2$H | —SO$_2$NHC(CH$_3$)$_3$ | 4-(SO$_2$NH$_2$)C$_6$H$_4$— | 4-NO$_2$ |
| CD-11 | —2-SO$_2$(CH$_2$)$_2$CO$_2$H | —SO$_2$NH—t-C$_4$H$_9$ | 4-(CO$_2$H)C$_6$H$_4$— | 4-NO$_2$ |
| CD-12 | —2-SO$_2$(CH$_2$)$_2$CO$_2$H | —SO$_2$NHCH$_3$ | 4-(SO$_2$NH$_2$)C$_6$H$_4$— | 4-NO$_2$ |
| CD-13 | —2-SO$_2$(CH$_2$)$_2$CO$_2$H | —SO$_2$N(morpholino) | 4-(SO$_2$NH$_2$)C$_6$H$_4$— | 4-NO$_2$ |
| CD-14 | —2-SO$_2$CH$_3$ | Cl | 4-(SO$_3$H)C$_6$H$_4$— | 4-NO$_2$ |
| CD-15 | —2-SO$_2$(CH$_2$)$_2$CO$_2$H | —SO$_2$N(C$_2$H$_5$)$_2$ | 4-(SO$_2$NH$_2$)C$_6$H$_4$— | 4-NO$_2$ |
| CD-16 | —2-SO$_2$(CH$_2$)$_2$CO$_2$H | —SO$_2$N(CH$_3$)$_2$ | —CH$_3$ | 4-NO$_2$ |

The preferred ionic dyes can be readily dissolved in a polar solvent for imbibition into a filter layer. Aqueous dye solutions can be employed. However, any other convenient polar solvent compatible with the filter layer can be employed or in combination with water, if desired, such as, for example, methanol, ethanol, dimethylsulfoxide, dioxane, ethanolamine, or mixtures thereof. Preferred solvents are those which increase the amount of dye which can be imbibed into the filter layer. Typically a small amount of a surfactant is also added to the dye solution to facilitate wetting of the filter layer.

As a further means of insuring that each subtractive primary dye is confined to a single filter layer, barrier layers between contiguous filter layers containing differing dyes can be employed. Useful barrier materials are known in the art and include, for example, nitrocellulose, poly(glycidyl methacrylate), poly(methyl methacrylate), and poly(isopropenyl ketone).

Polyester ionomers constitute a preferred class of barrier materials. A particularly preferred class of polymers which meets the above described criteria are photocrosslinkable polyester ionomers. In preferred polyester ionomers the polyester contains at least one aromatic dicarboxylic acid derived repeating unit which contains an alkali metal sulfonate group or an iminodisulfonyl unit containing monovalent cations as imido nitrogen atom substituents. Photocrosslinkable polyester ionomers preferably contain a dicarboxylic acid derived repeating unit containing non aromatic ethylenic unsaturation capable of providing crosslinking sites.

In particularly preferred forms, the polyesters contain at least three dicarboxylic acid derived repeating units. One dicarboxylic acid derived repeating unit is the photocrosslinking unit. This unit crosslinks with similar units on other polymer chains on exposure to activating radiation as described previously. Another dicarboxylic acid derived repeating unit is the hydrophobic unit. The third dicarboxylic acid derived repeating unit is a unit comprising a sulfonate ionic group, i.e., a hydrophilic unit. The photocrosslinking unit can comprise from 30 to 90 and preferably from 30 to 70 mole percent of the total acid units of the polyester. The hydrophobic and ionic units can comprise from 5 to 50 and from 2 to 40 mole percent, respectively, of the total acid units of the polyester. The photocrosslinking group can be either part of the polymer backbone or pendent therefrom.

Specific examples of polyester ionomers and their utility in forming barrier layers can be found in Arcesi et al U.S. Pat. No. 3,929,489, Wagner et al U.K. Pat. No. 1,407,059, and Hertman U.S. Pat. No. 4,315,978. Polyester ionomers are preferred barrier materials, since they are highly effective even when coated as thin layers.

Particularly preferred polyester ionomers are listed in Table III. According to convention, the glycol portion of the polyester is listed first, with the molar percentages following in parenthesis when more than one glycol portion is present, which is in turn followed by the carboxylic acid portions of the polyester, and the mole percentages of these portions listed in parenthesis.

TABLE III

| PEI-1 | Poly[ethylene-co-1,4-cyclohexylenedimethylene (70:30) 1,1,3-trimethyl-3-phenyl 5,4'indandicarboxylate-co-3,3'-sodioiminodisulfonyldibenzoate (45:50:5)] |
| --- | --- |
| PEI-2 | Poly[ethylene-co-1,4-cyclohexylenedimethylene (70:30) 1,1,3-trimethyl-3-phenyl-5,4'-indandicarboxylate-co-3,3'-(1,4-phenylene)diacrylate-co-5-(4-sodiosulfophenoxy)-1,3-benzenedicarboxylate (45:50:5)] |
| PEI-3 | Poly[1,4-cyclohexylenebis(oxyethylene)-3,3'(1,4-phenylene)diacrylate-co-3,3'-sodioiminosulfonyldibenzoate (95:5)] |

While the invention has been claimed in terms of blue, green, and red filters each formed by superimposed layers of subtractive primary dyes, it is appreciated for specialized applications hybrid filter arrays may be formed in which one or more of the filters is formed using an additive dye while still following the teachings of this invention with respect to the remaining filter and filters formed by superimposed layers of subtractive primary dyes.

EXAMPLES

The following specific preparations and examples further illustrate the invention:

PREPARATIONS

PREPARATION 1

Diazo resin-cationic mordant formulation 1

| 12% Aqueous solution of mordant M-24 | 25.0 g |
| --- | --- |
| Diazo resin A (a zinc tetrachloride double salt of a condensation product of 4-diazophenylamine and formaldehyde) | 1.0 g |
| 85% Aqueous solution of phosphoric acid | 0.3 g |
| Surfactant A (a 50% aqueous solution of nonylphenoxypolyglycerol) | 0.1 g |
| Poly(vinyl pyrrolidone) (Eastman Kodak) | 1.0 g |
| Deionized water | 5.0 g |

PREPARATION 2

Diazo resin-cationic mordant formulation 2

| 12% Aqueous solution of poly(N—vinyl-benzyl-N,N—dimethyl-N—cyclohexyl-ammonium chloride) mordant | 25.0 g |
| --- | --- |
| Diazo resin A | 0.9 g |
| 85% Aqueous solution of phosphoric acid | 0.3 g |
| Surfactant A | 0.1 8 |
| Poly(vinyl pyrrolidone) (Eastman Kodak) | 1.2 g |
| Deionized water | 40.0 g |

PREPARATION 3

Dye barrier polyester ionomer

| PEI-1 | 2.5 g |
| --- | --- |
| dichloromethane | 97.5 g |

PREPARATION 4

Dichromated gelatin formulation 1

| Gelatin (photoengraving glue) | 25.0 g |
| --- | --- |
| Deionized water | 25.0 g |
| 20% Aqueous solution of ammonium dichromate | 8.0 g |

PREPARATION 5

Dichromated gelatin formulation 2

| Gelatin (Photoengraving glue) | 25.0 g |
| --- | --- |
| Deionized water | 15.0 g |
| 20% Aqueous solution of ammonium dichromate | 8.0 g |

CYAN DYE SOLUTION 1

| CD-1 | 0.25 g |
| --- | --- |
| Surfactant A | 0.2 g |
| Methanol | 50 ml |
| pH 10 buffer | 50 ml |

CYAN DYE SOLUTION 2

| CD-3 | 0.5 g |
| --- | --- |
| Surfactant A | 0.2 g |
| Deionized water | 100 ml |
| pH adjusted to 3.5 with HCl | |

MAGENTA DYE SOLUTION 1

| MD-4 | 0.4 g |
|---|---|
| Surfactant A | 0.2 g |
| Methanol | 50 ml |
| pH 10 buffer | 50 ml |

MAGENTA DYE SOLUTION 2

| MD-5 | 1.0 g |
|---|---|
| Surfactant A | 0.2 g |
| Deionized water | 100 ml |
| pH adjusted to 3.0 with HCl | |

YELLOW DYE SOLUTION 1

| YD-1 | 0.4 g |
|---|---|
| Surfactant A | 0.2 g |
| pH 10 buffer | 100 ml |

YELLOW DYE SOLUTION 2

| YD-3 | 1.5 g |
|---|---|
| Surfactant A | 0.2 g |
| Deionized water | 100 ml |
| pH adjusted to 3.0 with HCl | |

EXAMPLE 1

A color filter array was fabricated on a 100 mm glass wafer according to the following procedure:
1. The wafer was spin coated at 3000 rpm with 10 mL of the diazo resin formulation of Preparation 1.
2. The wafer was exposed for 30 seconds to UV light through a "yellow" mask allowing exposure in areas representing both the green and red set of filters.
3. The wafer was rinsed for 20 seconds in deionized water to remove unexposed material.
4. The wafer immersed in Yellow Dye Solution 1 for 4 minutes and then rinsed with deionized water and dried.
5. The wafer was spin coated at 2000 rpm for 30 seconds with 10 mL of the dye barrier polyester ionomer of Preparation 3.

Steps 1 through 4 were repeated with the following changes:
1. Preparation 2 was spin coated at 4000 rpm.
2. Exposure was for 20 seconds through a "cyan" mask, allowing exposure in areas representing both the blue and green filters.
3. The wafer was dyed in Cyan Dye Solution 1 for 2 minutes.

Steps 1 through 4 were again repeated with the following changes:
1. Preparation 2 was spin coated at 6000 rpm.
2. Exposure was for 20 seconds through a "magenta" mask, allowing exposure in areas representing both the blue and red filters.
3. The wafer was dyed in Magenta Dye Solution 1 for 2 minutes.

The result was a high quality color filter array wherein (1) the cyan dyed filter layer overlapping the yellow dyed filter layer produced green filters that were 60% transmitting at 520 nm, (2) the magenta dyed filter layer overlapping the yellow dyed filter layer produced red filters that were 80% transmitting at 620 nm, and (3) the magenta dyed filter layer overlapping the cyan dyed filter layer produced filters that were 60% transmitting at 450 nm.

EXAMPLE 2

A color filter array was fabricated on a 100 mm glass wafer according to the following procedure:
1. The wafer was spin coated at 3500 rpm with 10 mL of the dichromated gelatin formulation of Preparation 4.
2. The wafer was exposed for 30 seconds to UV light through a cyan mask.
3. The wafer was rinsed for 30 seconds in deionized water to remove unexposed material.
4. The wafer was immersed in Cyan Dye Solution 2, which had been heated to 50° C., for 6 minutes and then rinsed with deionized water and dried.
5. The dyed gelatin was then hardened by a bake at 190° C. for 45 minutes.

Steps 1 through 5 were repeated with the following changes:
1. Preparation 4 was applied by spin coating at 5000 rpm.
2. Exposure was through a magenta mask.
3. The wafer was dyed in Magenta Dye Solution 2 for 3 minutes.

Steps 1 through 5 were repeated again with the following changes:
1. Preparation 5 was applied by spin coating at 3000 rpm.
2. Exposure was for 50 seconds through a yellow mask.
3. The wafer was dyed in Yellow Dye Solution 2 for 90 seconds.

The result was a high quality color filter array with green filters that were 70% transmitting at 520 nm, red filters that were 60% transmitting at 660 nm, and blue filters that were 50% transmitting at 440 nm.

EXAMPLE 3

A CCD semiconductor image sensor of the type shown in FIG. 7 was fabricated through the step of applying the planarizing layer 225. That is, all the structure shown in FIG. 7 was present, except the elements above the planarizing layer. A filter array was then formed on the surface of the charge coupled device by a sequence of steps similar to those described in Example 1, but with the dyes CD-2, MD-1, and YD-21 being imbibed in that order. The individual pixels of the sensor were less than $1 \times 10^{-8}$ m$^2$ in area. The sensor showed excellent chrominance discrimination in image recording.

The invention has been described in detail with particular reference to preferred embodiments thereof, but it will be understood that variations and modifications can be effected within the spirit and scope of the invention.

What is claimed is:

1. A filter array comprised of interlaid sets of laterally displaced first, second, and third additive primary filters, characterized in that
    said sets of filters are comprised of two discrete bottom layers, one bottom layer containing a first subtractive primary dye forming a bottom layer of said first and second filters and a second bottom layer containing a second subtractive primary dye forming a bottom layer of said third filters and said sets of filters being formed of two discrete overlying layers, one overlying layer containing said second subtractive primary dye forming an overlying layer of said first filters and a second overlying layer containing a third subtractive primary dye forming an overlying layer of said second and third filters, at least one of said bottom and overlying layers being of controlled thickness and containing a single subtractive primary dye.

2. A filter array according to claim 1 further characterized in that said overlying layer containing said second additive primary dye is an integral lateral extension of said bottom layer containing said second additive primary dye.

3. A filter array according to claim 1 further characterized in that said layer of controlled thickness is comprised of a hardened hydrophilic colloid.

4. A filter array according to claim 1 further characterized in that said layer of controlled thickness is comprised of a photoresist.

5. A filter array according to claim 4 further characterized in that said layer of controlled thickness is comprised of a diazo resin.

6. A filter array according to claim 1 further characterized in that said layer of controlled thickness is comprised of a mordant and said subtractive primary dye is an ionic dye.

7. A filter array according to claim 1 further characterized in that each of said filter layers is of controlled thickness and contains a single subtractive primary dye.

8. A filter array according to claim 7 further characterized in that each of said filter layers is a photopatterned layer comprised of a diazo resin and a cationic mordant saturated with an anionic subtractive primary dye.

9. A light sensing semiconductor device including an array of light sensing pixels each less than $1 \times 10^{-8} m^2$ in area comprised of a semiconductive substrate including a light sensing portion in each pixel area and a filter array for directing light to said semiconductive substrate comprised of interlaid sets of laterally displaced first, second, and third additive primary filters, each filter overlying one pixel, characterized in that said sets of filters are comprised of two discrete bottom layers, one bottom layer containing a first subtractive primary dye forming a bottom layer of said first and second filters and a second bottom layer containing a second subtractive primary dye forming a bottom layer of said third filters and said filters are comprised of two discrete overlying layers, one overlying layer containing said second subtractive primary dye forming an overlying layer of said first filters and a second overlying layer containing a third subtractive primary dye forming an overlying layer of said second and third filters, at least one of said bottom and overlying layers being of controlled thickness and containing a single subtractive primary dye.

10. A sensing device according to claim 10 further characterized in that said overlying layer containing said second additive primary dye is an integral lateral extension of said bottom layer containing said second additive primary dye.

11. A sensing device according to claim 10 further characterized in that said layer of controlled thickness is comprised of a hardened hydrophilic colloid.

12. A sensing device according to claim 10 further characterized in that said layer of controlled thickness is comprised of a photoresist.

13. A sensing device according to claim 13 further characterized in that said layer of controlled thickness is comprised of a diazo resin.

14. A sensing device according to claim 10 further characterized in that said layer of controlled thickness is comprised of a mordant and said subtractive primary dye is an ionic dye.

15. A sensing device according to claim 10 further characterized in that each of said filter layers is of controlled thickness and contains a single subtractive primary dye.

16. A sensing device according to claim 15 further characterized in that each of said filter layers is a photopatterned layer comprised of a diazo resin and a cationic mordant saturated with an anionic subtractive primary dye.

17. A sensing device according to claim 10 further characterized in that each pixel of said semiconductive device includes a photodiode.

18. A sensing device according to claim 10 further characterized in that a separate lens is provided overlying each filter within each pixel.

19. A device for displaying color images on a viewable surface comprised of a plurality of laterally displaced pixel areas, means for modulating within each pixel area the luminance of light transmitted to the viewable surface and a filter array for controlling within each pixel area the chrominance of light transmitted to the viewable surface comprised of interlaid sets of laterally displaced first, second, and third additive primary filters, characterized in that said sets of filters are comprised of two discrete bottom layers, one bottom layer containing a first subtractive primary dye forming a bottom layer of said first and second filters and a second bottom layer containing a second subtractive primary dye forming a bottom layer of said third filters and said sets of filters are comprised of two discrete overlying layers, one overlying layer containing said second subtractive primary dye forming an overlying layer of said first filter and a seconf overlying layer containing a third subtractive primary dye forming an overlying layer of said second and third filters, at least one of said bottom and overlying layers being of controlled thickness and containing a single subtractive primary dye.

20. An image displaying device according to claim 19 further characterized in that said overlying layer containing said second additive primary dye is an integral lateral extension of said bottom layer containing said second additive primary dye.

21. An image displaying device according to claim 19 further characterized in that said layer of controlled thickness is comprised of a hardened hydrophilic colloid.

22. An image displaying device according to claim 21 further characterized in that said layer of controlled thickness is comprised of dichromated gelatin or gelatin derivative.

23. An image displaying device according to claim 19 further characterized in that said layer of controlled thickness is comprised of a photoresist.

24. An image displaying device according to claim 23 further characterized in that said layer of controlled thickness is comprised of a diazo resin.

25. An image displaying device according to claim 19 further characterized in that said layer of controlled thickness is comprised of a mordant and said subtractive primary dye is an ionic dye.

26. An image displaying device according to claim 19 further characterized in that each of said filter layers is of controlled thickness and contains a single subtractive primary dye.

27. A image displaying device according to claim 26 further characterized in that each of said filter layers is a photopatterned layer comprised of a diazo resin and a cationic mordant saturated with an anionic subtractive primary dye.

* * * * *